United States Patent [19]
Merchant et al.

[11] Patent Number: 6,028,359
[45] Date of Patent: Feb. 22, 2000

[54] INTEGRATED CIRCUIT HAVING AMORPHOUS SILICIDE LAYER IN CONTACTS AND VIAS AND METHOD OF MANUFACTURE THEREFOR

[75] Inventors: Sailesh M. Merchant; Daniel J. Vitkavage; Susan C. Vitkavage, all of Orlando, Fla.

[73] Assignee: Lucent Technologies Inc., Murray Hill, N.J.

[21] Appl. No.: 09/073,556

[22] Filed: May 6, 1998

Related U.S. Application Data

[62] Division of application No. 08/816,185, Mar. 12, 1997, Pat. No. 5,858,873.

[51] Int. Cl.$^7$ .......................... H01L 23/48; H01L 23/52; H01L 29/40
[52] U.S. Cl. ..................... 257/750; 257/751; 257/754; 257/763
[58] Field of Search .................. 257/750–765, 257/771; 438/643, 650–660, 530

[56] References Cited

U.S. PATENT DOCUMENTS

| | | | |
|---|---|---|---|
| 4,800,176 | 1/1989 | Kakumu et al. | 437/193 |
| 4,960,732 | 10/1990 | Dixit et al. | 437/192 |
| 4,962,414 | 10/1990 | Liou et al. | 357/71 |
| 4,975,753 | 12/1990 | Ema | 257/757 |
| 4,976,839 | 12/1990 | Inoue | 204/192.17 |
| 5,106,781 | 4/1992 | Penning De Vries | 437/192 |
| 5,322,812 | 6/1994 | Dixit et al. | 438/643 |
| 5,332,691 | 7/1994 | Kinoshita et al. | 437/192 |
| 5,355,020 | 10/1994 | Lee et al. | 257/765 |
| 5,371,041 | 12/1994 | Liou et al. | 438/655 |
| 5,380,678 | 1/1995 | Yu et al. | 437/190 |
| 5,397,742 | 3/1995 | Kim | 437/190 |
| 5,420,074 | 5/1995 | Ohshima | 437/193 |
| 5,451,551 | 9/1995 | Krishman et al. | 437/241 |
| 5,504,038 | 4/1996 | Chien et al. | 437/192 |
| 5,514,908 | 5/1996 | Liao et al. | 257/751 |
| 5,529,955 | 6/1996 | Hibino et al. | 437/195 |
| 5,585,308 | 12/1996 | Sardella | 437/190 |
| 5,591,671 | 1/1997 | Kim et al. | 437/190 |
| 5,641,985 | 6/1997 | Tamura | 257/530 |
| 5,851,581 | 12/1998 | Zenke | 438/656 |

OTHER PUBLICATIONS

Stanley Wolf Ph.D. & Richard N. Tauber, Ph.D., "Silicon Processing for the VLSI Era"; 1986 Lattice Press; pp. 331–335 and pp. 384–392.

Hyeongtag Jeon, Gangjoong Yoon, & R.J. Nemanich; Dependence of the C49–C54 TiSi$_2$ phase transition temperature on film thickness and Si substrate orientation; 1997 Elsevier Science S.A.–Thin Solid Films 299; pp. 178–182.

J. Perez–Rigueiro, P. Herrero, C. Jimenez, R. Perez–Casero and J. M. Martinez–Duart; Characterization of the Interfaces Formed During the Silicidation Process of Ti Films on Si at Low and High Temperatures; Surface and Interface Analysis vol. 25–1997; pp. 896–903.

Primary Examiner—Minh Loan Tran
Assistant Examiner—Cuong Quang Nguyen

[57] ABSTRACT

An integrated circuit, a contact and a method of manufacture therefor. The integrated circuit has a silicon substrate with a recess formed therein that provides an environment within which the contact is formed. The contact includes: (1) an adhesion layer deposited on an inner surface of the recess, (2) an amorphous layer, deposited over the adhesion layer within the recess and (3) a central plug, composed of a conductive material, deposited at least partially within the recess, the silicide layer being amorphous to prevent the conductive material from passing through the amorphous silicide layer to contact the adhesion layer thereby to prevent junction leakage.

21 Claims, 2 Drawing Sheets

INTEGRATED CIRCUIT HAVING AMORPHOUS SILICIDE LAYER IN CONTACTS AND VIAS AND METHOD OF MANUFACTURE THEREFOR

This Application is a Divisional of prior application Ser. No. 08/816,185, filed on Mar. 12, 1997, currently pending, to Sailesh M. Merchant. The above-listed Application is commonly assigned with the present invention and is incorporated herein by reference as if reproduced herein in its entirety under Rule 1.53(b).

TECHNICAL FIELD OF THE INVENTION

The present invention is directed, in general, to semiconductor devices and, more specifically, to an integrated circuit having an amorphous silicide layer in contacts or vias thereof and a method of manufacture for the integrated circuit.

BACKGROUND OF THE INVENTION

The extensive use of semiconductors, such as integrated circuit ("IC") devices, in a wide range of electronic applications is well known. A typical semiconductor device is comprised of a series of contact openings ("windows") formed in a substrate material, such as silicon that has doped source and drain regions. The interconnection of these windows provides a circuit for the conduction of electrical current through the device. The windows have a metallic "plug" deposited therein, which is tungsten in most applications. The plug is overlaid with a conductive metal trace, such as aluminum-alloy, which includes, for example, aluminum-copper, aluminum-silicon or aluminum-copper-silicon. The conductive metal trace is laid down in a predetermined pattern that electrically connects the various windows to achieve the desired electrical circuit configuration within the semiconductor device.

Typically, the windows have a barrier layer of titanium overlaid with titanium nitride formed over the surface of the interior sides of the window to serve as an adhesion/nucleation layer for tungsten. Various problems, however, have arisen with respect to the metals used to form the plugs and trace patterns between these windows. For example, the titanium and titanium nitride layers are typically deposited by physical vapor deposition ("PVD"), whereas the tungsten is deposited by chemical vapor deposition ("CVD"). These different deposition methods use very different tools to achieve the deposition. Thus, the semiconductor device is placed in a PVD tool for the formation of the titanium and titanium nitride layers, removed and placed in a CVD tool to form the tungsten plug, and then returned to the PVD tool for the deposition of the aluminum-alloy interconnect. These transfers not only require time, it also subjects the device to oxidation and contaminants, which in turn, can affect the quality of the device. Moreover, because tungsten does not have a sufficiently high enough electrical conductivity, the excess tungsten that is deposited on the surface of the semiconductor device must be etched-back or polished-back prior to its return to the PVD tool, which involves yet another step in the manufacturing process. These inefficiencies increase the overall manufacturing time and cost of the semiconductor device.

In view of these disadvantages, it has become desirable to use aluminum-alloys for the metal plug. Unfortunately, however, aluminum-alloy also has problems associated with its use. It is well known that mutual diffusion of aluminum-alloy and silicon occurs between the silicon substrate and the aluminum-alloy plug when the semiconductor device is subjected to the high temperatures necessary for semiconductor manufacturing. The aluminum-alloy can diffuse into the silicon substrate to such a depth to cause a short within the semiconductor device. This phenomenon is known as junction leakage. The aluminum-alloy is able to diffuse into the silicon substrate because conventional processes produce barrier layers that have crystalline structures with grain boundaries. As such, the aluminum-alloy is capable of diffusing through these grain boundaries and into the silicon substrate.

Attempts have been made to address the problem of the diffusion problem associated with such crystalline structures. Two such attempts are disclosed in U.S. Pat. No. 4,976,839 and U.S. Pat. No. 5,514,908. Both of these patents are directed to processes that are designed to circumvent the problems associated with such crystalline structures and resulting grain boundaries existing within the barrier layers. However, they too fall short in providing a satisfactory solution in that they may form grain boundaries that might not be adequately stuffed with oxygen as a result of the complex manufacturing processes to achieve a layer boundary through which aluminum-alloy will not diffuse.

Therefore, what is need in the art is a semiconductor and a simple process for manufacturing thereof that avoids the problems associated with crystalline barrier layers that allow diffusion of the aluminum into the silicon. The semiconductor and the manufacturing process of the present invention address these needs.

SUMMARY OF THE INVENTION

The present invention provides an integrated circuit and a contact that resist junction leakage, and a method of manufacture therefor. The integrated circuit has a silicon substrate with a recess formed therein that provides an environment within which the contact is formed. The contact includes: (1) an adhesion layer deposited on an inner surface of the recess, (2) an amorphous layer deposited over the adhesion layer within the recess and (3) a central plug, composed of a conductive material, deposited at least partially within the recess. The non-crystalline amorphous layer substantially prevents the conductive material from passing through the amorphous layer to contact the adhesion layer thereby to prevent junction leakage.

In a preferred embodiment of the present invention, the adhesion layer is composed of titanium and titanium nitride and the central plug is comprised of aluminum-alloy. The titanium forms the first layer that is deposited over the silicon substrate.

In another aspect of the present invention, the adhesion layer, the central plug and the amorphous layer are deposited by physical vapor deposition.

The amorphous layer is preferably a silicide layer that includes an element selected from the group consisting of zirconium, molybdenum, tantalum or cobalt, and more preferably, the amorphous layer is comprised of tungsten silicide.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
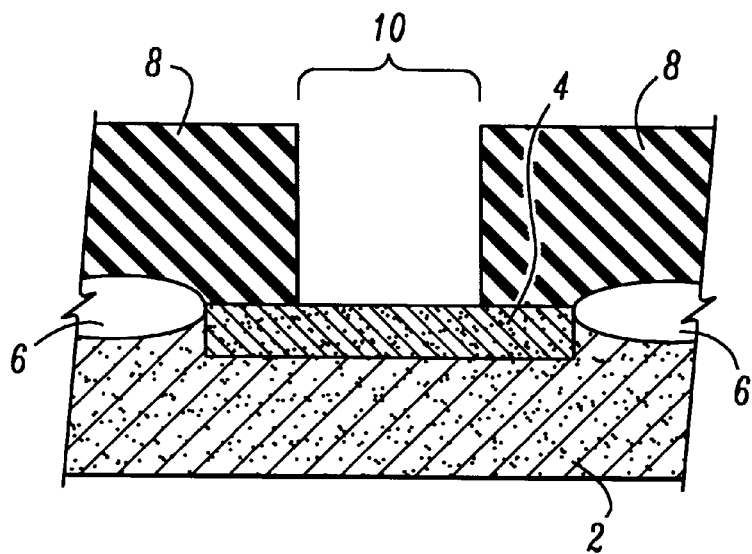
FIG. 1 illustrates a cross-sectional view of an exemplary, partially manufactured integrated circuit prior to deposition of any barrier layers.

Referring initially to FIG. 1, there is illustrated a cross-section portion of an integrated circuit that has been partially fabricated. At this stage of manufacture, the device's structure is entirely conventional and includes a silicon substrate 2 that has a doped diffusion region 4 formed therein, which is of opposite conductivity type from that of substrate 2. For example, substrate 2 may be a lightly doped p-type silicon and diffusion region 4 may be heavily doped n-type silicon. Of course, as noted above, other structures known to those skilled in the art may be used. For instance, the substrate 2, instead, may be a well or tub region in a CMOS process. Diffusion region 4 is bounded by a field oxide structure 6, which is also formed in a conventional manner. In this particular embodiment, diffusion 4 is very shallow, such as on the order of 0.15 microns, which is a conventional thickness for modern integrated circuits having sub-micron feature sizes. Thus, diffusion region 4 may be formed by ion implantation of the dopant followed by a high-temperature anneal to form the junctions, as is well known in the art. Alternatively, the ion implantation may be performed prior to the formation of subsequent layers, with the drive-in anneal performed later in the process, if desired.

A dielectric layer 8, which may be a deposited oxide or another type of dielectric layer, is formed over the diffusion region 4 and field oxide 6. The dielectric layer 8 electrically isolates overlying conductive structures from the diffusion region 4, except at locations where contacts therebetween are desired. A contact opening 10, which may be a window or via, has been formed through the dielectric layer 8 in a conventional manner, such as by way of reactive ion etching or another type of known anisotropic etching. Contact opening 10 may be as small as less than one micron in width, as is typical for modern sub-micron integrated circuits. Preferably, the contact opening 10 has a width of that ranges from about 0.3 to about 0.8 microns and an aspect ratio that ranges from about 1.0 to about 3.0. As previously stated, each of the structures illustrated in FIG. 1 may be formed according to conventional processes known to those of skill in the art of the integrated circuit manufacture, including thicknesses of the various structures and methods of formation.

Figure 2:
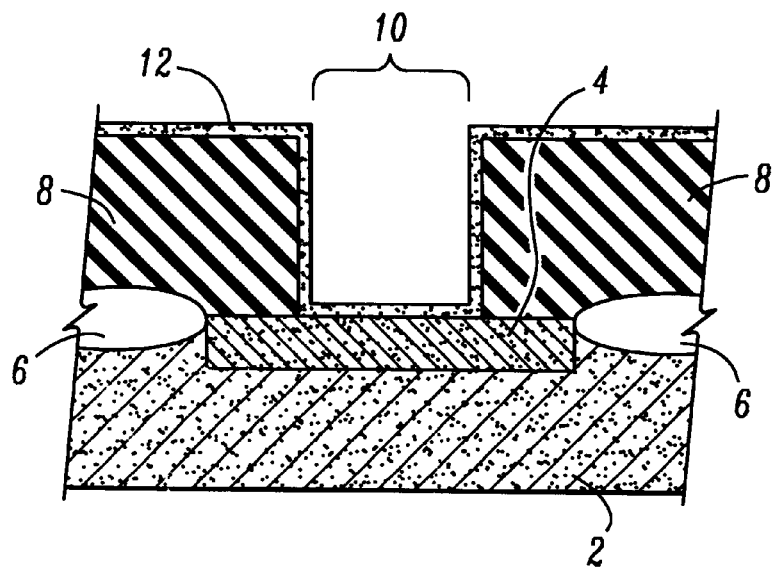
FIG. 2 illustrates a cross-sectional view of the exemplary integrated circuit device of FIG. 1 with the adhesion layer deposited thereon and within the window.

Turning now to FIG. 2, after completion of the structure illustrated in FIG. 1, a thin adhesive, but conductive, layer 12 is deposited over the inner surface of the contact opening 10 and the top portion of the substrate 2. The adhesion layer 12 is preferably deposited by sputtering or PVD techniques and at pressures and temperatures that are well known in the art. The thickness of the adhesion layer 12 may range from about 10.0 nm to about 100.0 nm. In a preferred embodiment, however, the thickness of the adhesion layer 12 is about 30.0 nm. It will, of course, be appreciated that the thickness of the adhesion layer 12 is selected according to the thickness of the amorphous layer that is to be formed at the contact location, and as such, the thickness may vary, depending on the application. In the preferred embodiment, the adhesion layer 12 is titanium, but other conductive metals known to those skilled in the art may also be used in place of titanium, such as tantalum, zirconium, hafnium, tungsten, or molybdenum. Moreover, the adhesion layer 12 may also include various stack schemes, such as titanium/titanium nitride/titanium, etc.

Figure 3:
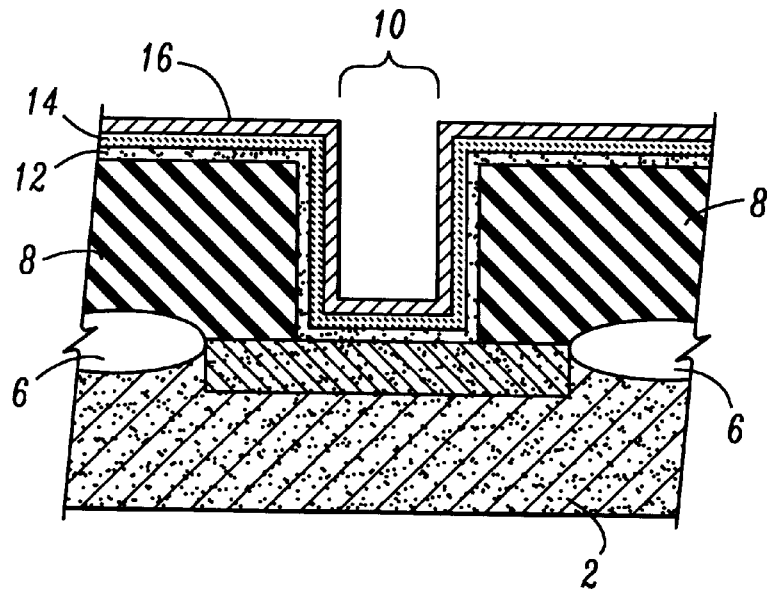
FIG. 3 illustrates a cross-sectional view of the exemplary integrated circuit device of FIG. 2 with the amorphous layer deposited over the adhesion layer and the titanium nitride barrier layer.

Turning now to FIG. 3, a layer 14 comprised of a refractory material is deposited over the adhesion layer 12 in a conventional manner to a preferred thickness of about 100.0 nm. Examples of the refractory material that can be used in the present invention are titanium nitride, titanium carbide, titanium boride, tantalum nitride, tantalum carbide, tantalum boride, zirconium nitride, zirconium carbide, zirconium boride, hafnium nitride, hafnium carbide, hafnium boride, tungsten nitride, tungsten carbide tungsten boride, molybdenum nitride, molybdenum carbide and molybdenum. Preferably, however, the refractory material is titanium nitride. A conventional PVD method at conventional temperatures that range from about 25° C. to about 400° C. and pressures that range from about 1 milliTorr to about 10 milliTorr are used to deposit the titanium nitride layer 14 in a preferred embodiment. PVD deposition techniques are preferred because the semiconductor device does not have to be transferred to a different tool, which decreases manufacturing time and eliminates particle defects and contamination problems associated with moving the device from one deposition tool to another. As discussed in the art, the PVD deposition of titanium nitride apparently forms a layer 14 having a crystalline structure with grain boundaries. As such, this layer 14 does not serve as a good boundary layer to prevent diffusion of aluminum-alloy into silicon. Accordingly, the present invention provides an amorphous, non-crystalline layer that is deposited over the layer 14.

Continuing to refer to FIG. 3, an amorphous layer 16, in accordance with the present invention, is shown deposited over the titanium nitride layer 14. The amorphous layer 16 is preferably deposited by conventional PVD techniques at a temperature that ranges from about 25° C. to about 400° C. and at pressures that range from about 1 milliTorr to about 20 milliTorr. More preferably, however, the deposition temperature is about 400° C. and the deposition pressure is about 2 milliTorr. The PVD tool used to deposit the amorphous layer 16 is a conventional PVD tool, well known to those skilled in the art and is the same tool used to deposit the previously-discussed adhesive and titanium nitride layers.

Experimental results indicate that the amorphous layer 16 is non-crystalline, and thus, does not have the grain boundaries associated with crystalline structures found in the prior art. Thus, the amorphous layer 16 provides a continuous layer through which a metal plug, such as aluminum-alloy cannot diffuse. Moreover, the amorphous layer 16 can be deposited using the same PVD methods used to deposit the adhesion layer 12 and the titanium nitride layer 14. As such, the semiconductor device does not have to be transferred to another deposition tool, such as a CVD tool, as is typically done in conventional processes. In most applications in the art, the semiconductor device is removed from the PVD tool following deposition of the titanium nitride layer and transferred to a CVD tool where a tungsten plug is deposited over the titanium nitride layer. As previously discussed, because the vacuum on the tool must be broken to transfer the device, this subjects the semiconductor device to possible defects and contamination from the environment during the transfer from one tool to another. Further, manufacturing time, and thus, the cost of the device increase with these transfers. Because the amorphous layer 16 can be deposited with PVD techniques, the problems of the prior art are avoided; that is, the vacuum on the tool can be maintained, which greatly reduces the risks of oxidation and environmental contamination.

In a preferred embodiment, the amorphous layer 16 is a metal-silicide layer. The silicon is bonded with a metal wherein the metal may be, for example, titanium, tungsten, zirconium, molybdenum, tantalum or cobalt. More preferably, however, the metal silicide layer is a tungsten silicide ($WSi_x$) wherein the value for x ranges between about 2 and about 2.5. In a more preferred embodiment, the ratio of silicon to tungsten in the molecular structure is about 1:2.5. While different methods of deposition can be used to deposit the tungsten silicide over the titanium layer 14, it is preferred that PVD methods are used. The deposition is conducted until a silicide layer having the desired thickness is formed. Preferably, the thickness may range from about 30.0 nm to about 100.0 nm, and more preferably, the thickness of the amorphous layer 16 is about 50.0 nm. The PVD deposition method of the amorphous silicide provides an excellent amorphous boundary layer that prevents diffusion of the plug metal into the substrate 2. Additionally, it acts as a wetting layer for the in situ formation of the metal plug, which aids the metal's deposition in the very small opening 10, as opposed to prior art titanium wetting layers for in situ aluminum plug formation.

Figure 4:
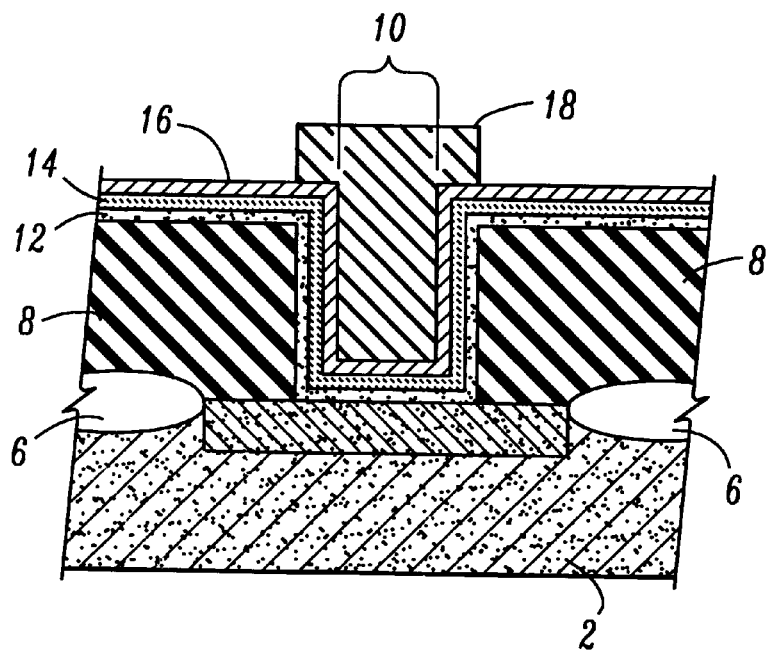
FIG. 4 illustrates a cross-sectional view of the exemplary integrated circuit device of FIG. 3 with the metallic plug deposited within the window and after etch-back/or planarization formation of the plug.

Turning now to FIG. 4, there is illustrated the semiconductor device of the present invention in which a metal plug 18 has been deposited in the layered contact opening 10. As with the other previously deposited layers, the preferred method of deposition is with a PVD tool. Again, this allows the critical steps of the semiconductor fabrication to take place in a single deposition tool. The metal plug 18 may be comprised of various types of conductive metals, including alloys that are effective conductors of electrical current. For instance, the metal plug 18 may be of an aluminum-alloy or copper. More preferably, however, the metal plug is comprised of aluminum-alloys.

An aluminum-alloy plug has several advantages over the tungsten plugs of the prior art. For example, after the tungsten's deposition, the excess tungsten is removed with an etch-back step, followed by a deposition of aluminum interconnect and an etch-back of the aluminum-alloy. When a tungsten plug is used in a semiconductor device, the excess deposition of tungsten on the surface of the substrate must be etched-back so that an aluminum-alloy trace can be deposited over the tungsten plug. After the tungsten's etch-back, aluminum-alloy is then deposited and the desired trace pattern in formed by yet another etch-back process. The reason that an aluminum plug is used in place of the already present tungsten is that tungsten has a higher resistivity than aluminum-alloy, and thus, is not as good a conductor as aluminum-alloy. Another advantage is that when aluminum-alloy is used for the plug in place of tungsten, the aluminum-alloy plug and the trace pattern can easily be formed in one sequence by conventional etch-back processes.

From the above, it is apparent that the present invention provides a semiconductor device that has a silicon substrate with a recess formed therein that provides an environment within which the contact is formed. The contact includes: (1) an adhesion layer deposited on an inner surface of the recess, (2) an amorphous layer deposited over the adhesion layer within the recess and (3) a central plug, composed of a conductive material, deposited at least partially within the recess, the silicide layer being amorphous to prevent the conductive material from passing through the amorphous silicide layer to contact the adhesion layer thereby to prevent junction leakage. The adhesion layer is preferably composed of titanium and the central plug is comprised of aluminum-alloy. Moreover, it is preferred that the adhesion layer, the central plug and the amorphous layer are deposited by physical vapor deposition.

The amorphous layer is preferably a silicide layer that includes an element selected from the group consisting of zirconium, molybdenum, tantalum or cobalt, and more preferably, the amorphous layer is comprised of tungsten silicide.

The method of manufacturing of the present invention also provides distinct advantages over the art. In the present method, the semiconductor device is left in the PVD tool during all steps of layer deposition. The titanium layer, the titanium nitride layer, the amorphous layer and the metal plug are all deposited using PVD methods. As previously explained, this decreases manufacturing time and the costs associated therewith because the device does not have to be transferred from one deposition tool to another. Further, it decreases the risks of contamination of the device.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

What is claimed is:

1. For use in an integrated circuit, said integrated circuit having a substrate with a window formed therein, a contact, comprising:

an adhesion layer formed on an inner surface of said window;

an amorphous metal silicide layer formed over said adhesion layer; and at least one central plug, composed of a conductive material, formed within said window.

2. The contact as recited in claim 1 wherein said adhesion layer is composed of titanium.

3. The contact as recited in claim 1 wherein said adhesion layer and said central plug are deposited by physical vapor deposition.

4. The contact as recited in claim 1 wherein said amorphous layer is a metal silicide layer includes an element selected from the group consisting of zirconium, tungsten, molybdenum, tantalum or cobalt.

5. The contact as recited in claim 1 wherein said amorphous metal silicide layer is comprised of tungsten silicide.

6. The contact as recited in claim 1 wherein said amorphous metal silicide layer is deposited by physical vapor deposition.

7. The contact as recited in claim 1 wherein said central plug is comprised of aluminum-alloy.

8. The contact as recited in claim 1 wherein said central plug is a non-conformal structure.

9. An integrated circuit, comprising:

a substrate having a plurality of recesses formed therein proximate a plurality of doped regions therein, said doped region cooperating to act as electronic devices; and a plurality of contacts formed in said plurality of recesses, said contacts cooperating to act as terminals for said electronic devices, at least one of said plurality of contacts including:

an adhesion layer formed on an inner surface of a corresponding one of said plurality of recesses;

an amorphous metal silicide layer formed over said adhesion layer within said recess; and a central plug, composed of a conductive material, formed at least partially within said recess, said cental plug providing electrical connection between a first material layer and a second material layer of said integrated circuit.

10. The integrated circuit as recited in claim 9 wherein said adhesion layer is composed of a titanium nitride layer overlaying a titanium layer.

11. The integrated circuit as recited in claim 9 wherein said adhesion layer is comprised of titanium.

12. The integrated circuit as recited in claim 9 wherein said adhesion layer and said central plug are deposited by physical vapor deposition.

13. The integrated circuit as recited in claim 9 wherein said amorphous metal silicide layer is deposited by physical vapor deposition.

14. The integrated circuit as recited in claim 9 wherein said central plug is composed of an aluminum-alloy.

15. The integrated circuit as recited in claim 9 wherein said amorphous metal silicide layer includes an element selected from the group consisting of zirconium, tungsten, molybdenum, tantalum or cobalt.

16. The contact as recited in claim 15 wherein said first and second material layers are on different levels within said integrated circuit.

17. The contact as recited in claim 16 wherein said first material layer is a metal layer and said second material layer is another metal layer.

18. The contact as recited in claim 9 wherein said integrated circuit includes an active area of a transistor and said first material is said active material and said contact plug electrically connects said active area with said second material layer.

19. The contact as recited in claim 18 wherein said active area includes a silicide or salicide junction area and said contact plug electrically connects said silicide or salicide junction area with said second material layer.

20. The contact as recited in claim 18 wherein said second material layer is a metal layer on a different level than said silicide or salicide junction area.

21. For use in an integrated circuit, said integrated circuit having a substrate with a plurality of windows formed therein, a contact, comprising:

an adhesion layer formed on an inner surface of at least one of said plurality of windows;

an amorphous metal silicide layer formed over said adhesion layers; and a central plug, composed of a conductive material, formed at least partially within at least one of said plurality of windows.

* * * * *